United States Patent [19]
Kuroki et al.

[11] Patent Number: 6,066,565
[45] Date of Patent: May 23, 2000

[54] METHOD OF MANUFACTURING A SEMICONDUCTOR WAFER

[75] Inventors: Hideyo Kuroki; Masahiko Maeda, both of Miyazaki, Japan

[73] Assignee: Komatsu Electronic Metals Co., Ltd., Kanagawa, Japan

[21] Appl. No.: 09/195,405

[22] Filed: Nov. 19, 1998

[30] Foreign Application Priority Data

Nov. 21, 1997 [JP] Japan .................................. 9-320869

[51] Int. Cl.⁷ .................................................. H01L 21/302
[52] U.S. Cl. ........................ 438/692; 438/690; 438/691; 438/706
[58] Field of Search ..................... 438/692, 691, 438/689, 706; 451/190, 194; 156/636.1

[56] References Cited

U.S. PATENT DOCUMENTS 5,514,025  5/1996  Hasegawa et al. ....................... 451/44
5,769,695  6/1998  Katayama .............................. 451/209
5,942,445  8/1999  Kato et al. ............................ 438/691

*Primary Examiner*—Benjamin L. Utech
*Assistant Examiner*—Lan Vinh
*Attorney, Agent, or Firm*—Welsh & Katz, Ltd.

[57] ABSTRACT

A sliced wafer 1a is obtained by cutting it off from a semiconductor ingot. The rear and front surfaces of the sliced wafer 1a are flattened by the first double side simultaneous grinding process so as to remove unevenness 12a. The ground rear and front surfaces of the sliced wafer 1a whose unevenness 12a has been removed are subject to the second double side simultaneous grinding process. The flattened back side surface of the sliced wafer 1b is sucked so as to chamfer the outer peripheral portion 1b of the sliced wafer 1b. Then, the surface of the chamfered wafer 1c is etched.

7 Claims, 9 Drawing Sheets

METHOD OF MANUFACTURING A SEMICONDUCTOR WAFER

BACKGROUND OF THE INVENTION

1. Field of the Invention

The present invention relates to a method of manufacturing a semiconductor wafer, and in particular to an efficient method of manufacturing a semiconductor wafer in a proper chamfered shape.

2. Description of the Prior Art

Conventionally, the following steps performed manufacturing of semiconductor wafers.

(1) Slicing a semiconductor ingot into plural sliced wafers.

(2) Chamfering the outer peripheries of the sliced wafers.

(3) Flattening the chamfered wafers by a process such as lapping.

(4) Removing distortion layer in processing of the chamfered wafers, which is induced during the flattening process, by alkali etching or acid etching.

(5) Polishing at least one side surface of the each etched wafer to obtain mirror-surface wafers.

In the process of flattening, lapping performed by batch processing is preferred due to its high productivity. However, it is quite difficult to obtain desired flatness by the above lapping process if the device processes require high degree of flatness.

Furthermore, following the increasing in diameter of semiconductor wafers, it is quite difficult to lap a semiconductor wafer with diameter greater than 12 inches so as to obtain such high degree of flatness. Additionally, the enlargement of lapping equipment is also a problem.

Therefore, in the process of manufacturing large-diameter semiconductor wafers, instead of batch processing, various types of surface grinding processes are used because the flatness of the semiconductor wafers is much more important than productivity. For example, a double side simultaneous grinding process is brought into public notice. The double side simultaneous grinding process produces high-flatness semiconductor wafers with productivity higher than that of a single-sided surface grinding process. The double side simultaneous grinding process is performed by simultaneously grinding both of the front surface and the back side surface of a semiconductor wafer with an upper grinder and a lower grinder.

Unexamined Japanese Patent Publication No. H9-260314 entitled "METHOD OF MANUFACTURING SEMICONDUCTOR WAFERS" discloses the above various types of surface grinding processes. In H9-260314, processes for flattening the chamfered and sliced wafers by the above-mentioned various types of surface grinding processes such as double side simultaneous grinding process are described.

However, the processes disclosed in H9-260314, the single-sided surface grinding process or the double side simultaneous grinding process have respectively the following disadvantages.

(1) Single-Sided Surface Grinding

FIGS. 8a–8c are side cross-sectional views showing the contours of a semiconductor wafer flattened by a conventional single-sided surface grinding process. FIG. 8a shows a sliced wafer 5a cut off from a semiconductor ingot, and unevenness 52a such as waviness or warp exists on its surface.

To remove the unevenness 52a, the back side surface 51a has to be fixed firmly by a vacuum chuck and then the outer peripheral portion of the wafer 5a is chamfered. As shown in FIG. 8b, because the back side surface 51b is parallel with the adsorption face 50 of the vacuum chuck, the sliced wafer 5a is affixed along the adsorption face 50. As a result, the adsorption face 50 is taken as the working reference plane of the chamfering process.

The wafer 5b chamfered by taking the adsorption face 50 as the working reference plane is guided to be surface-ground in the state of being affixed by the sucker of a grinding machine. The discrepancy between the thickness central plane which is taken as the working reference plane of the surface grinding and the chamfering central plane which is taken as the working reference plane of chamfering will arise according to the inclination of the sliced wafer 5b being sucked. Under this circumstance, a part of the chamfered portion of the wafer 5c will be removed after performing the surface grinding both sides of the wafer 5b (see FIG. 8c).

(2) Double Side Simultaneous Grinding

FIGS. 9a–9c are side cross-sectional views showing the contours of a semiconductor wafer flattened by a conventional double side simultaneous grinding process. As shown in FIG. 9a, chamfering process is performed before double side simultaneous grinding process. The back side surface 61a of the sliced wafer 6a is taken as the working reference plane during chamfering process in the same way as the above-mentioned single-sided surface grinding process.

However, in the process of double side simultaneous grinding process, both sides of the sliced wafer 6a are simultaneously ground. Therefore, the contact surfaces 60a and 60b at which the grindstones contact with the unevenness surfaces are taken to be the working reference plane of grinding. In the case that the unevenness of the sliced wafer 6a is significant, the discrepancy will occur between the working reference plane of grinding and the working reference plane 60c of chamfering (see FIG. 9b). Consequently, a part of chamfered portion will be removed (see FIG. 9c).

Breakage and chipping are inclined to take place in the wafers with their chamfered portions partly removed during the succeeding processes. Even if breakage or chipping did not happen, there still exists a danger of being unable to meet the standard for chamfered shape, which is required by device proceedings.

SUMMARY OF THE INVENTION

In view of the above-described defects, the object of the present invention is to provide a method of manufacturing semiconductor wafers, which is effective to form the chamfered portion in proper shape.

The characteristic of this invention is to coincide the thickness central plane of the sliced wafer with the chamfering central plane of the sliced wafer. With this arrangement, the flattening process taking the thickness central plane as its working reference and the chamfering process taking the chamfering central plane as its working reference can be independently performed without influencing each other. Therefore, semiconductor wafers with proper chamfered contour can be obtained.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
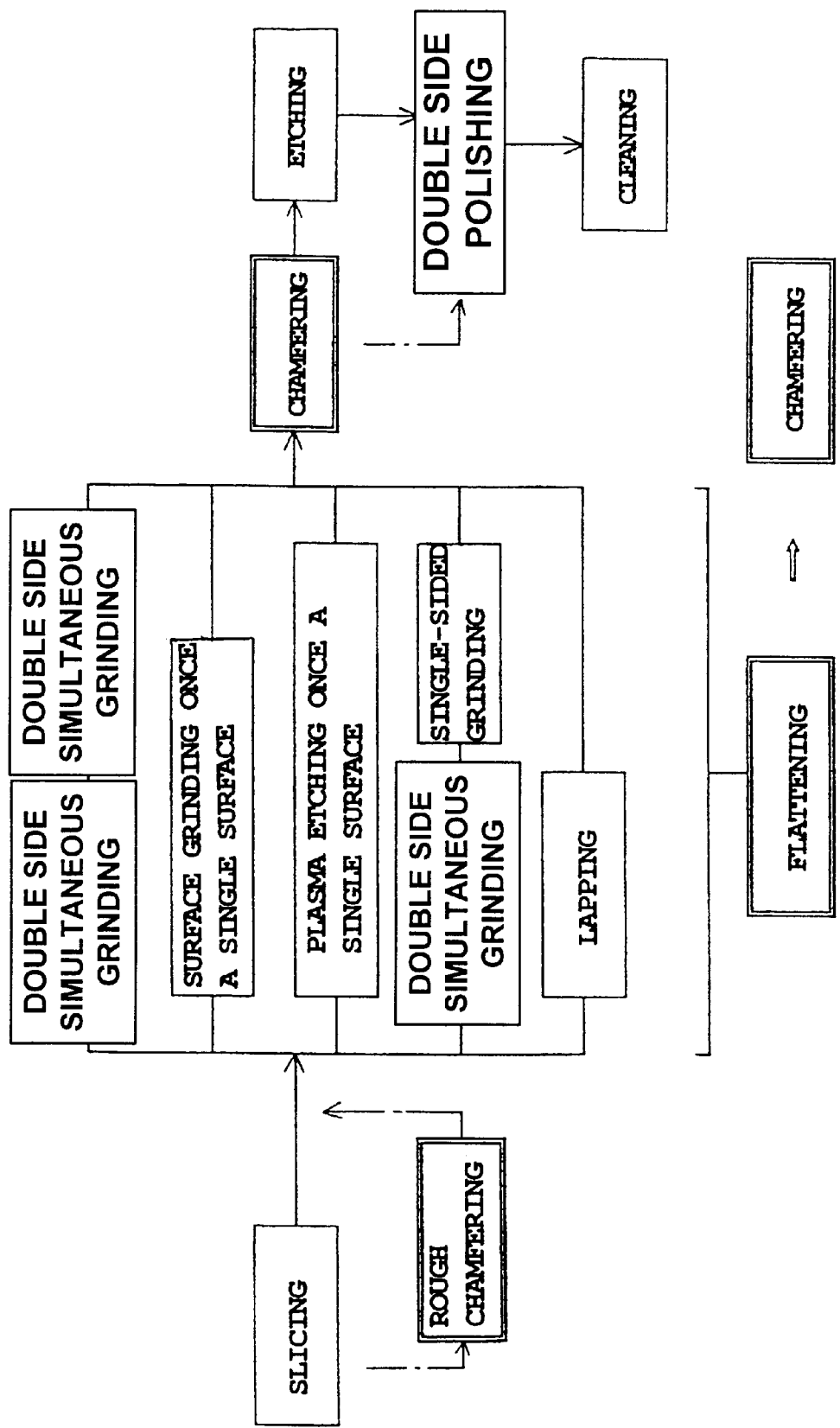
FIG. 1 is a process chart showing the method of manufacturing a semiconductor wafer in accordance with the first, the second, and the third embodiments of this invention.

The inventors of this invention intended to remove any influence imposed by the flattening process on the chamfering process and noticed the discrepancy between the thickness central plane of the sliced wafer and the chamfering central plane of the sliced wafer. The inventors constructed this invention through the following proceedings.

At first, considering the working reference planes of flattening and chamfering. In the case of double side simultaneous grinding process, the thickness center of the sliced wafer should be taken as the working reference plane. In the case of single-sided surface grinding process, the adsorption face sucked by the sucker of the grinding machine should be taken as the working reference plane; and in the case of chamfering process, the adsorption face sucked by the sucker of the grinding machine should be taken as the working reference plane.

If the surface unevenness of the sliced wafer is significant, then the sliced wafer will be sucked and kept in an inclined attitude during chamfering process. This will drive the working reference plane of chamfering away from the thickness central surface of the sliced wafer.

In light of the above, the inventors have created the construction of flattening the surfaces of the sliced wafers to a certain extent and sucking the flattened surfaces by the sucker. With this arrangement, it is possible to coincide the working reference plane of flattening with the working reference plane of chamfering.

On condition that the working reference plane of flattening coincides with the working reference plane of chamfering, flattening and chamfering will not affect each other. No matter chamfering process is performed before flattening process or in the reversed order, a high accuracy outcome can be obtained.

This invention is attained basing on the above perception, and provides a technique of flattening and chamfering sliced wafers with high accuracy.

The following is a concrete description of this invention.

This invention is a method of manufacturing a semiconductor wafer having a chamfer which is sliced from a semiconductor ingot, comprising a flattening step of flattening the surface of the sliced wafer to coincide the thickness central plane of the sliced wafer with the chamfering central plane of the sliced wafer; and a chamfering step of forming the chamfer on the sliced wafer whose thickness central plane coincides with the chamfering central plane in the flattening step.

In the flattening step, the surface of the sliced wafer is flattened to a certain extent and the thickness central plane of the sliced wafer coincides with the chamfering central plane of the sliced wafer. The thickness central plane of the sliced wafer is located at the center between the upper surface and the lower surface of the sliced wafer. The chamfering central plane of the sliced wafer is located at the center of an upper chamfer and a lower chamfer of the sliced wafer.

It is acceptable to flatten the surface of the sliced wafer to a certain extent that enables the thickness central plane to coincide with the chamfering central plane, even if the unevenness of the surface still remains. Of course, it is also acceptable to flatten the surface of the sliced wafer completely.

Furthermore, it is satisfactory to grind the surface of the sliced wafer by two steps, in other words, rough grinding the surface of the sliced wafer to shape them in order to adjust the shape of the sliced wafer, and then fine grinding the surface of the sliced wafer.

Furthermore, it is also acceptable to perform flattening process by rough grinding the outer peripheral portion of the sliced wafer to restrain breakage or chipping to the minimum extent.

Conventional methods of flattening the surface of the sliced wafer, such as double side simultaneous grinding process, single-sided surface grinding, plasma etching, or lapping, can be used in the flattening step of this invention.

The chamfering step is a step of forming the chamfer on the outer peripheral portion of the sliced wafer whose thickness central plane coincides with the chamfering central plane. It is within the scope of this invention that the surface of the sliced wafer is subject to the fine grinding or plasma etching to enhance their flatness after the chamfering step.

As above described, the major characteristic of this invention is that the thickness central plane of the sliced wafer coincides with the chamfering central plane of the sliced wafer. It is possible to utilize the following steps when the surface of the sliced wafer is ground by performing the single-sided grinding.

A method of manufacturing a semiconductor wafer having a chamfer, which is sliced from a semiconductor ingot, comprising a parallel surface forming step of flattening at least one side surface of the sliced wafer and forming a parallel surface which is parallel to the chamfering central plane of the chamfer of; and a chamfering step of sucking the parallel surface by the sucker, and forming the chamfer in the sucked state.

Even if the thickness central plane of the sliced wafer does not coincide with the chamfering central plane of the sliced wafers, a surface which is parallel to the chamfering central plane of the sliced wafer is formed. The sliced wafer can be horizontally held when the parallel surface is firmly sucked. Therefore, in the flattening the surface of the sliced wafer, the removal of the chamfered portion can be avoided.

DETAILED DESCRIPTION OF THE PREFERRED EMBODIMENTS

The First Embodiment

FIG. 1 is a process chart showing the method of manufacturing a semiconductor wafer in accordance with the first, the second, and the third embodiments of this invention. FIG. 1 is used for helping the understanding of the whole construction of this invention. The following description can be understood by timely referring to FIG. 1.

Figure 2:
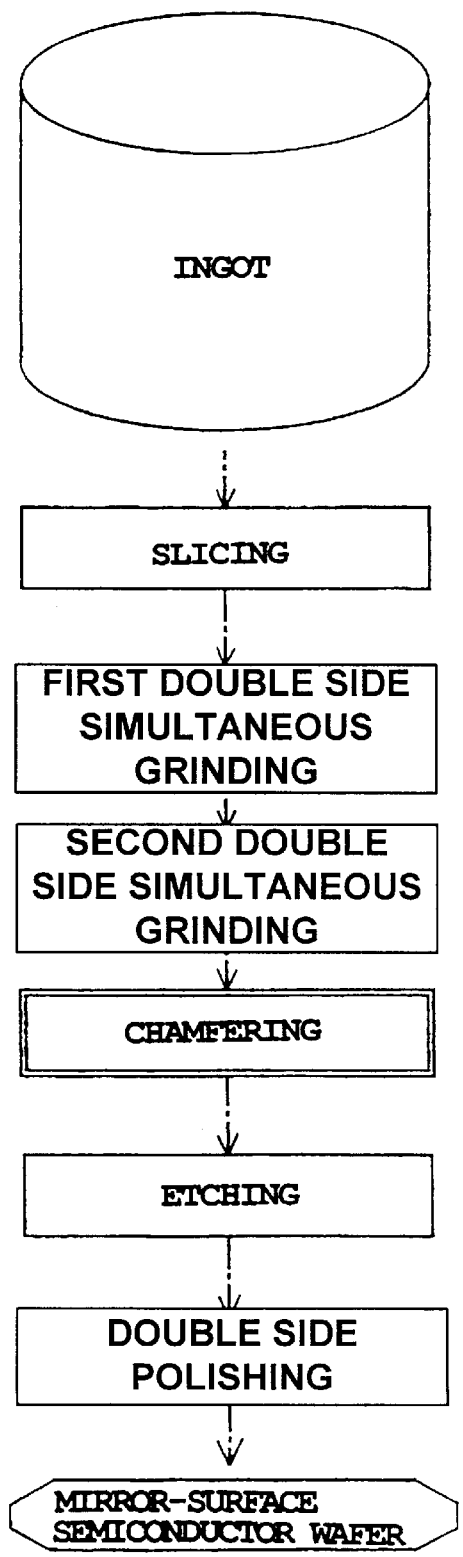
FIG. 2 is a process chart showing the method of manufacturing semiconductor wafers in accordance with the first embodiment of this invention.

FIG. 2 is a process chart showing the method of manufacturing semiconductor wafers in accordance with the first embodiment of this invention.

FIGS. 3a–3d are side cross-sectional views showing the contours of a semiconductor wafer manufactured in accordance with the first embodiment of this invention.

As shown in FIG. 2 and FIGS. 3a–3d, the method of manufacturing a semiconductor wafer in accordance with the first embodiment of this invention is performed as follows.

Figure 3A:
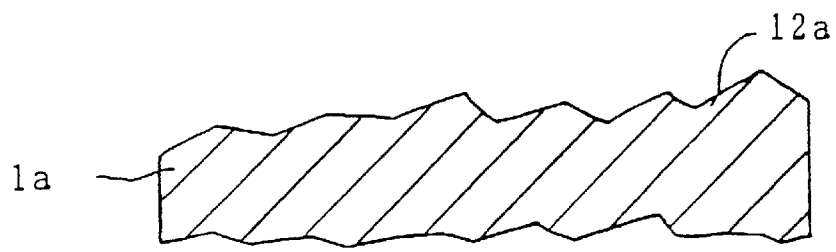
FIGS. 3a–3d are side cross-sectional views showing the contours of a semiconductor wafer manufactured in accordance with the first embodiment of this invention.

(1) As shown in FIG. 3a, the sliced wafer 1a is obtained by cutting it off from a semiconductor ingot, wherein unevenness 12a such as waviness is existing on both of the rear and front surfaces of the sliced wafer 1a.

Figure 3B:
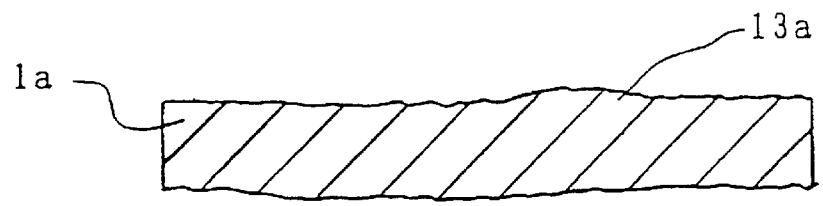
Figure 3C:
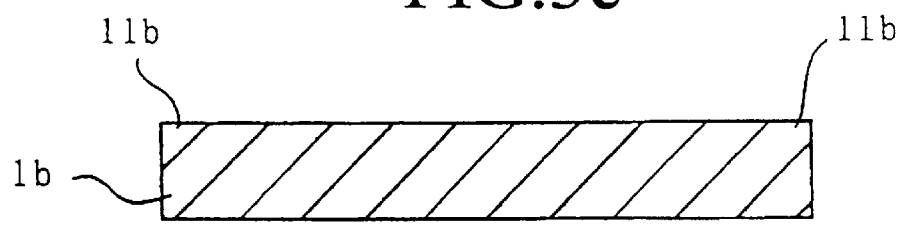

(2) The rear and front surfaces of the sliced wafer 1a are flattened by the first double side simultaneous grinding process so as to remove the unevenness 12a such as waviness which is incurred by cutting operation. In this step, the major purpose of the double side simultaneous grinding process is to shape the contour of the sliced wafer by rough grinding. Therefore, as shown in FIG. 3b, tiny unevenness 13a still exists on the rear and front surfaces of the sliced wafer 1a.

(3) Next, the sliced wafer 1a is subject to the second double side simultaneous grinding process. In this step, the major purpose of the double side simultaneous grinding process is to finish grind the rear and front surfaces so as to enhance their flatness and to reduce the distortion layer in processing incurred during the first double side simultaneous grinding process (see FIG. 3c). The load of succeeding surface working can be reduced by performing fine grinding process and the productivity can be enhanced.

Figure 3D:
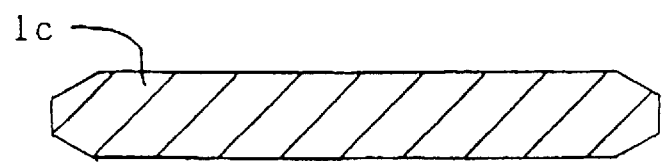

(4) The fine ground back side surface of the sliced wafer 1b is sucked and the outer peripheral portion 1b of the sliced wafer 1b is chamfered (see FIG. 3d). The chamfering process is performed by using conventional technique such as polishing or grinding.

(5) The surface of the chamfered wafer 1c is etched to remove the distortion layer in processing incurred during the second double side simultaneous grinding process and the chamfering process.

The Second Embodiment

This embodiment is an example showing flattened shape of a sliced wafer is obtained through various types of surface grinding processes or lapping processes that are performed after rough chamfering process as shown in FIG. 1.

Figure 4:
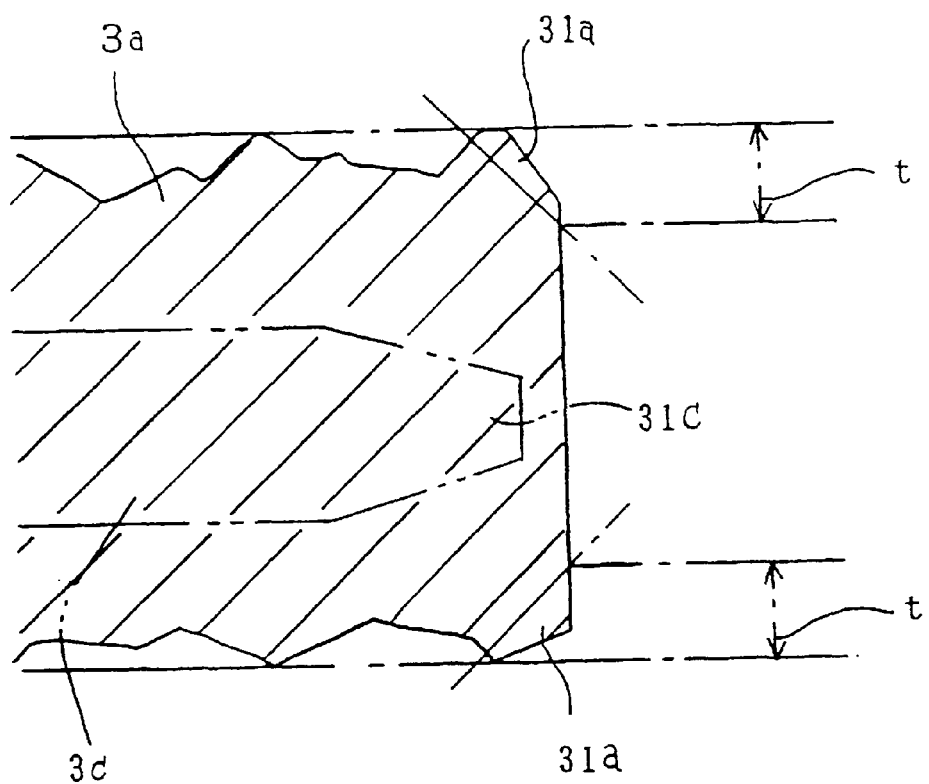
FIG. 4 is a partially enlarged side cross-sectional view showing the contour of a semiconductor wafer manufactured in accordance with the second embodiment of this invention.

FIG. 4 is a partially enlarged side cross-sectional view showing the contour of a semiconductor wafer manufactured in accordance with the second embodiment of this invention. As shown in FIG. 4, the rough chamfering process performed in this embodiment is to remove the edges 31a, which will not affect the contour of the outer peripheral portion 31c of the wafer 3c, before grinding the sliced wafer 3a so as to obtain the sliced wafer 3c. For example, taking the sliced wafer 3a to be one of 8 inches in diameter and 800–900 μm in thickness, then the thickness t removed by rough chamfering process is about 50–100 μm.

The rough chamfering process is performed in order to prevent the breakage or chipping occurred during the shifting of the sliced wafer 3a between its surface flattening process and the succeeding chamfering process.

The Third Embodiment

This embodiment is an example showing that flattening is performed respectively before and after the chamfering process.

Figure 5:
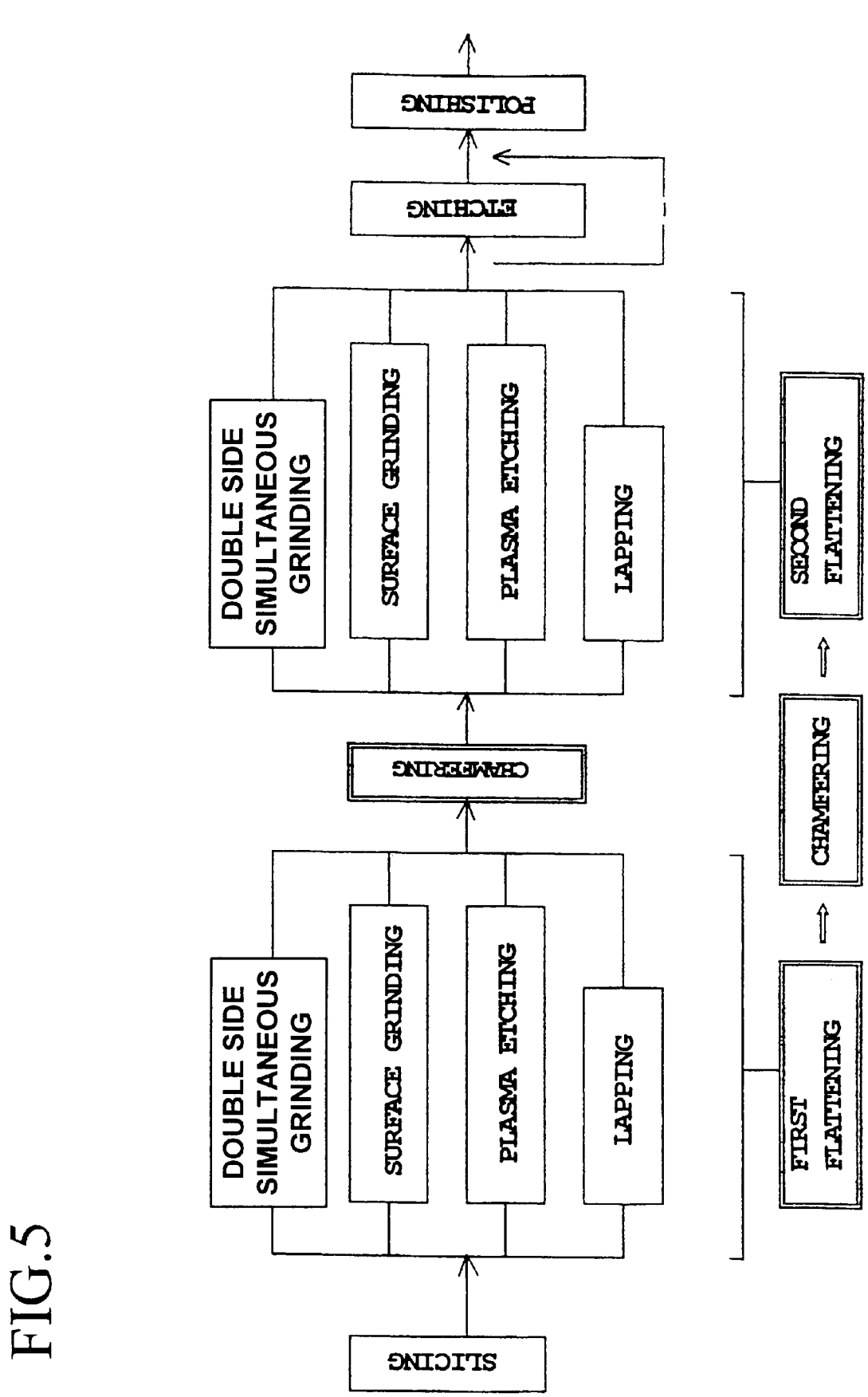
FIG. 5 is a process chart showing the method of manufacturing semiconductor wafers in accordance with the third embodiment of this invention.

FIG. 5 is a process chart showing the method of manufacturing semiconductor wafers in accordance with the third embodiment of this invention.

Figure 6A:
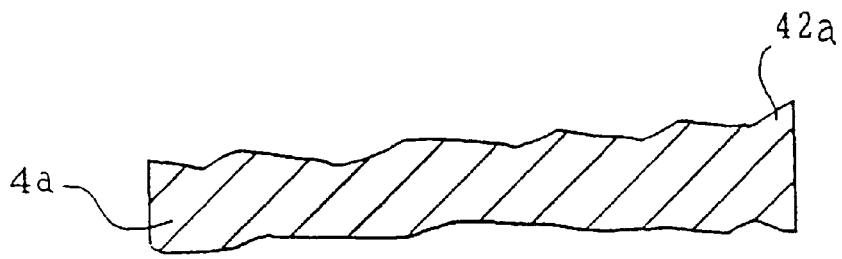
FIGS. 6a–6d are side cross-sectional views showing the contours of a semiconductor wafer manufactured in accordance with the third embodiment of this invention.
Figure 6B:
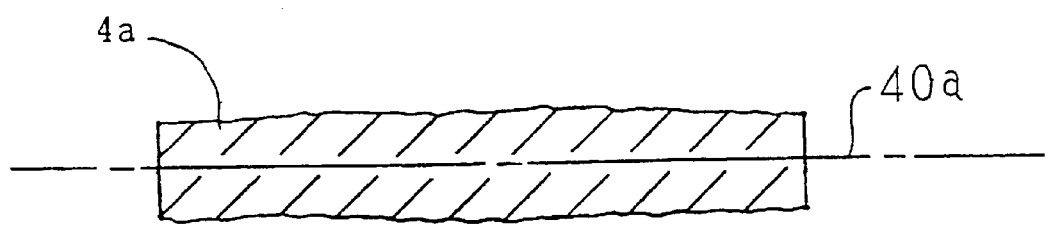

FIGS. 6a–6d are side cross-sectional views showing the contours of a semiconductor wafer manufactured in accordance with the third embodiment of this invention. As shown in FIG. 6a, in the beginning, the sliced wafer 4a cut off from a semiconductor ingot is double side simultaneous ground, which is called the first surface grinding process. By this, unevenness 42a existing on the rear and front surfaces of the sliced wafer 4a is roughly removed (see FIG. 6b).

Figure 6C:
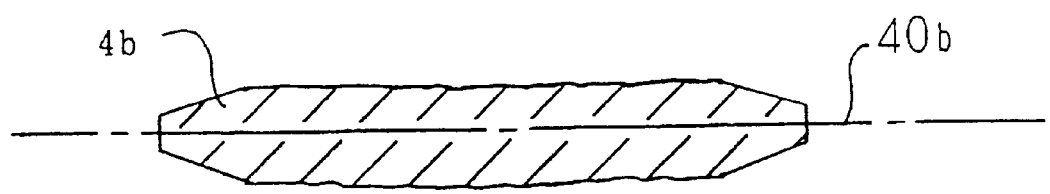

Next, the surface-ground back side surface of the sliced wafer 4a is sucked so as to chamfer its outer peripheral portion. Because the unevenness 42a has been roughly removed, the thickness central plane 40a shown in FIG. 6b and the chamfering central plane 40b shown in FIG. 6c are coinciding with each other.

Figure 6D:
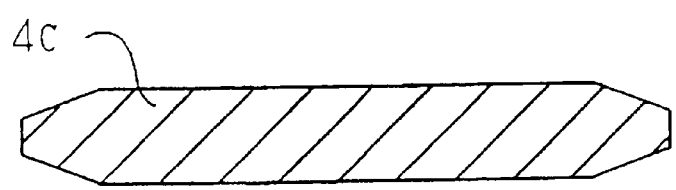

Later, the chamfered sliced wafer 4a is double side simultaneous ground, which is called the second surface grinding process, so as to obtain a wafer 4c with desired flatness (see FIG. 6d).

The Fourth Embodiment

This embodiment is an example showing that accuracy flattening of the sliced wafer is performed by the dry-type plasma etching process.

In the third embodiment, the accuracy flattening of the sliced wafer is performed by the second surface grinding process. However, in this embodiment, instead of the second surface grinding process, the accuracy flattening of the sliced wafer is performed by plasma etching process.

The plasma etching process is well known for its high accuracy in controlling the thickness of the work-piece to be removed and is taking the place of conventional wet-type dipping etching processes recently. Furthermore, due to that any load will not impose on the outer peripheral portion of the wafer during etching, breakage or chipping will not occur even if the wafer does not have a chamfer.

Therefore, it is suitable for flattening the sliced wafers. In addition, it is possible to flatten the chamfer by performing the plasma etching process.

Figure 7:
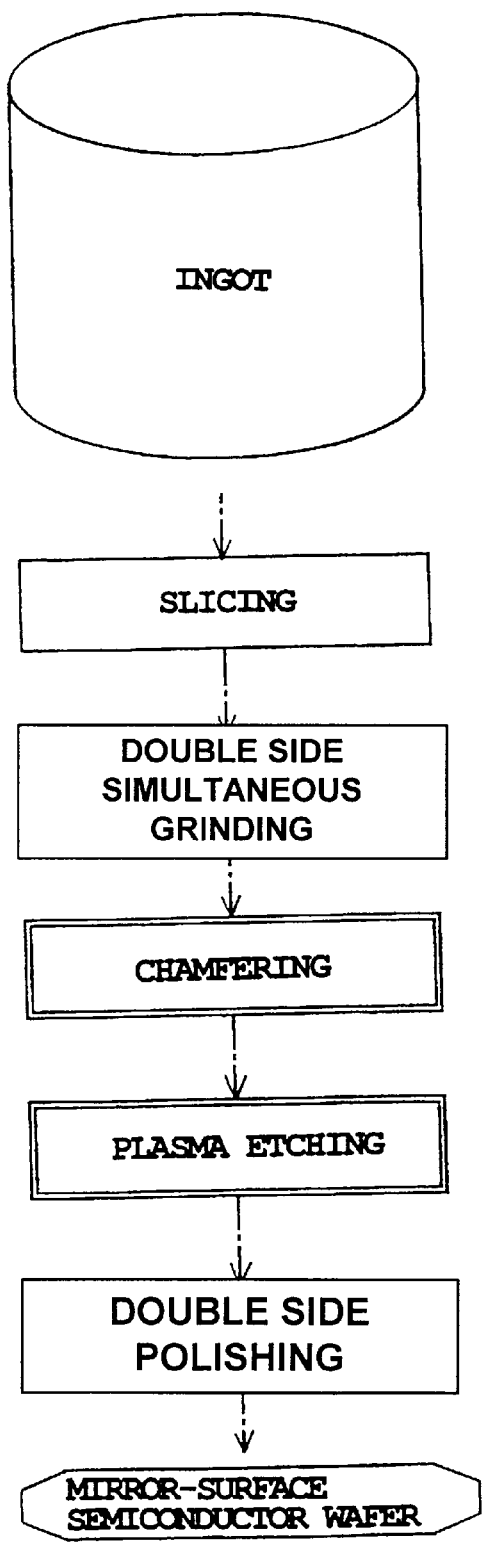
FIG. 7 is a process chart showing the method of manufacturing semiconductor wafers in accordance with the fourth embodiment of this invention.
Figure 8A:
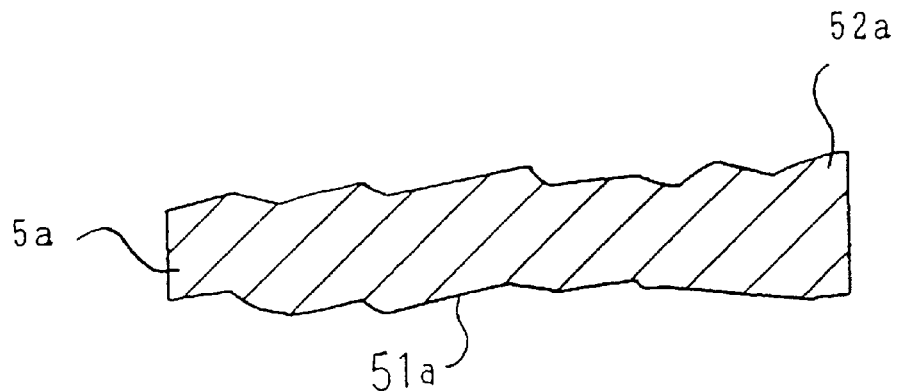
FIGS. 8a–8c are side cross-sectional views showing the contours of a semiconductor wafer flattened by a conventional single-sided surface grinding.
Figure 8B:
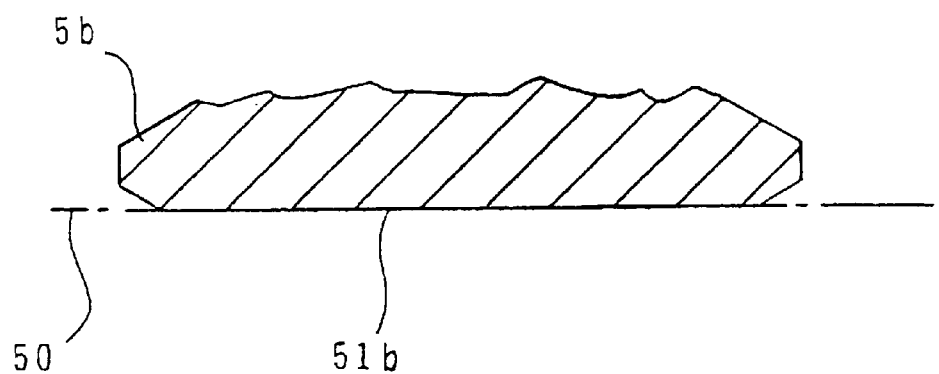
Figure 8C:
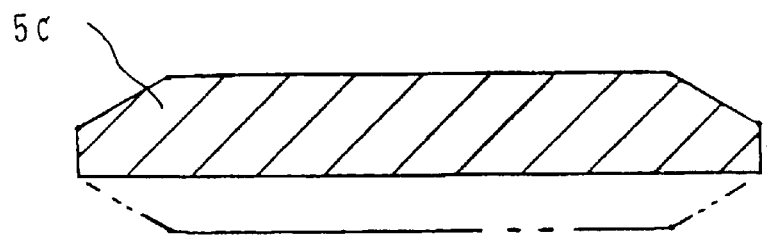
Figure 9A:
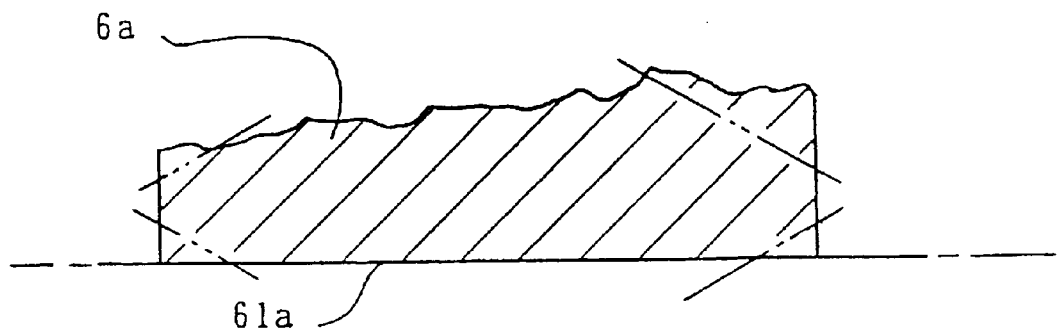
FIGS. 9a–9c are side cross-sectional views showing the contours of a semiconductor wafer flattened by a conventional double side simultaneous grinding.
Figure 9B:
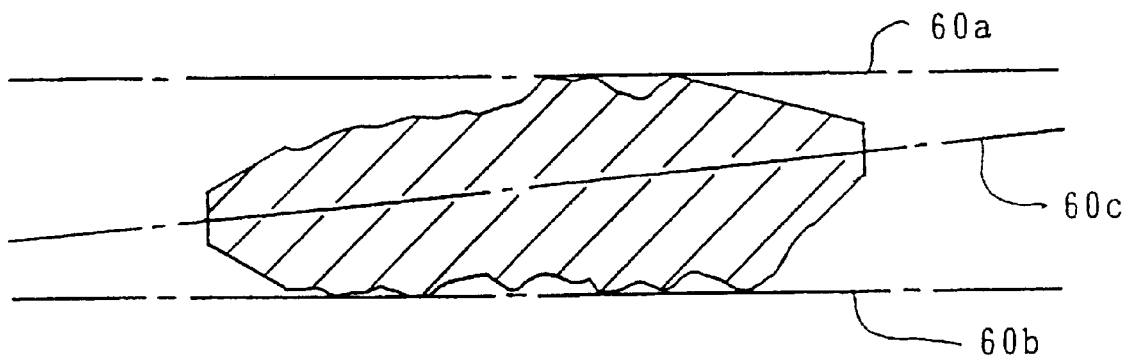
Figure 9C:
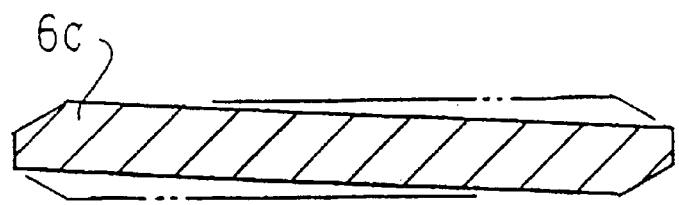

FIG. 7 is a process chart showing the method of manufacturing semiconductor wafers in accordance with the fourth embodiment of this invention. As shown in FIG. 7, in this embodiment, the unevenness on the front and back side surfaced of the sliced wafer is removed by double side simultaneous grinding process to a certain extent, so as to coincide the chamfering central plane with the working reference plane of the plasma etching which is performed subsequent to the chamfering process.

After that, the outer peripheral portion of the sliced wafer is chamfered, and the chamfered wafer is plasma etched. The flatness of the surfaces and chamfered portion can be enhanced by plasma etching, and the distortion layer in processing induced during the double side simultaneous grinding process can be removed.

If the plasma etching is performed after chamfering process, the etching process prior to the polishing process (see FIG. 5) can also be omitted.

What is claimed is:

1. A method of a manufacturing a semiconductor wafer, which is sliced from a semiconductor ingot and has a chamfer, comprising the following steps in sequence:

a flattening step of flattening a surface of the sliced wafer to coincide a thickness central plane of the sliced wafer with a chamfering central plane of the sliced wafer; and a chamfering step of forming the chamfer on the sliced wafer so that the thickness central plane is maintained to coincide with the chamfering central plane by the flattening step.

2. A method of manufacturing a semiconductor wafer, as claimed in claim 1, wherein the flattening step simultaneously grinds a front surface and a back side surface of the sliced wafer.

3. A method of manufacturing a semiconductor wafer, as claimed in claim 2, wherein the flattening step comprises:

a rough grinding step of rough grinding the surface of the sliced wafer to adjust a shape of the sliced wafer; and a fine grinding step of fine grinding the rough ground surface of the sliced wafer to flatten the rough ground surface.

4. A method of manufacturing a semiconductor wafer, as claimed in claim 1, further comprising:

a rough chamfering step of rough chamfering an outer peripheral portion of the sliced wafer, wherein
   the flattening step flattens the surface of the sliced wafer which the rough chamfering step has rough chamfered.

5. A method of manufacturing a semiconductor wafer, as claimed in claim 1, further comprising:

a fine grinding step of fine grinding the surface of the sliced wafer having the chamfer formed by the chamfering step to enhance flatness of the surface.

6. A method of manufacturing a semiconductor wafer, as claimed in claim 1, further comprising:

a plasma etching step of plasma etching the surface of the sliced wafer having the chamfer formed by the chamfering step to enhance flatness of the surface.

7. A method of manufacturing a semiconductor wafer, which is sliced from a semiconductor ingot and has a chamfer, comprising:

a parallel surface forming step of flattening at least one side surface of the two side surfaces of the sliced wafer, and forming a flattened surface which is parallel to a chamfering central plane of the chamfer; and then, a chamfering step of sucking the parallel surface by a sucker, and forming the chamfer on both side surfaces of the sliced wafer in a sucked state so that the thickness central plane is maintained parallel to the chamfering central plane.

* * * * *